Sept. 2, 1969 A. J. W. M. VAN OVERBEEK ET AL 3,465,261
RESONANT CIRCUIT ARRANGEMENT
Filed Aug. 25, 1966
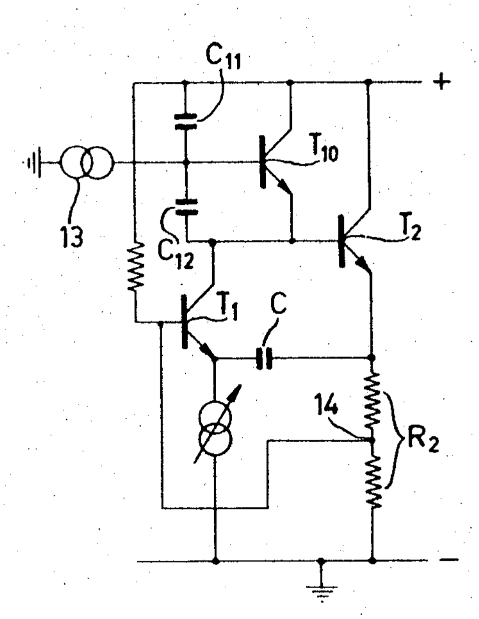
INVENTORS
ADRIANUS J. W. M. VAN OVERBEEK
WILHELMUS A. J. M. ZWIJSEN
BY
Frank R. Trifari
AGENT

United States Patent Office 3,465,261
Patented Sept. 2, 1969

3,465,261

RESONANT CIRCUIT ARRANGEMENT

Adrianus Johannes Wilhelmus Marie van Overbeek and Wilhelmus Antonius Joseph Marie Zwijsen, Eindhoven, Netherlands, assignors, by mesne assignments, to U.S. Philips Corporation, New York, N.Y., a corporation of Delaware Filed Aug. 25, 1966, Ser. No. 574,964
Claims priority, application Netherlands, Aug. 26, 1965, 6511133
Int. Cl. H03f 3/42
U.S. Cl. 330—18 6 Claims

ABSTRACT OF THE DISCLOSURE

A resonantly tunable circuit having two transistors interconnected with a phase shifting feedback coupling and a second phase shifting network connected to the collector base interconnection of the first and second transistor, the second phase shifting network having a third transistor with its emitter collector path connected to the collector of the first transistor so as to supply the current through the first transistor, the base electrode of the third transistor connected to the tap on a potential divider.

The invention relates to a resonant circuit arrangement and more particularly to a circuit arrangement for selectively amplifying or generating signals without the need for inductively tuned circuits.

In the circuit arrangements hitherto known, for example, as in copending U.S. application Ser. No. 493,491, filed Oct. 6, 1965, there is employed a first and a second transistor each having emitter-, base- and collector-electrodes; the collector of the first transistor being connected to the base of the second transistor, and phase-shifting feedback coupling being provided between at least one of the remaining electrodes of the second transistor and an electrode of the first transistor. This arrangement provides a resonantly tunable circuit while avoiding the use of inductors, making it suitable for modern and semi-conductor technology, i.e. integrated circuits, solid state devices and the like wherein the use of inductors gives rise to certain processing and manufacturing difficulties. The resonance frequency and the resonance sharpness of such an arrangement can be varied in a simple but satisfactorily reproducible manner.

As described in the aforementioned patent application, the collector of the first transistor includes the series-combination of at least two semi-conductor diodes polarized in the forward direction and connected to the phase-shifting elements such that the phase-shift from the collector of the first transistor to the base of the second transistor and the phase-shift of the feedback coupling are equal in magnitude but of opposite polarity at the resonance frequency of the circuit. The product of amplification and feedback at resonance is substantially equal to unity.

A disadvantage in the implementation of the above described circuit is that the signal voltage amplitude permissible across the series combination of semi-conductor diodes, without leading to undesirable distortion, has been found to be comparatively low. It is therefore a primary object of this invention to provide a non-inductive resonant circuit which will be free from distortion at high signal voltage amplitude levels. The invention fulfills its prime object in that the series-combination of semi-conductor diodes is replaced by the emitter-collector path of an auxiliary transistor, the base of which is connected to a voltage divider included between the emitter and the collector of the auxiliary transistor.

The invention is based on the discovery that an auxiliary transistor may under proper conditions, be made to simulate a series-combination of diodes. Measuring the current as a function of the voltage between the emitter and the collector of the auxiliary transistor, and assuming the voltage divider ratio to be $1:n$, the voltage across the divider portion between the emitter and the base will exceed the inner emitter-base threshold voltage when the emitter-collector voltages exceed $n$ times this threshold voltage thereby causing the transistor to start conveying current. By increasing the emitter-collector voltage to high values, it has been found that a corresponding increase in current takes place in accordance with the current-voltage characteristic curve of the emitter-base diode. Increasing the emitter-collector voltage by an amount $\Delta V_{ec}$ results in the voltage at the portion of the divider included between the base and the emitter of the auxiliary transistor increasing by an amount $\Delta V_{ec}/n$. Therefore, the base current increases in accordance with the emitter-base diode characteristic curve and the collector current increases in accordance with this diode characteristic curve, assuming the collector-base current amplification factor of the auxiliary transistor has a sufficiently high value. Conversely, the collector-emitter current amplification factor of the transistor is just below unity. Variations of ambient temperature influence the emitter-base diode characteristic curve in the manner described in the aforesaid U.S. application Ser. No. 493,491, while the differential resistance of this diode characteristic curve is dependent upon the bias current. This dependence upon temperature and bias current therefore follows the same laws as those of a single diode or as those of the auxiliary transistor replacing the emitter-base path of these diodes. That is to say the differential resistance of this transistor with its divider is $n$ times higher than the differential resistance of the emitter-base diode of this transistor, and the dependence upon temperature and bias current of this differential resistance follows the same laws. Current flow through the divider is negligibly low with respect to that flowing through the auxiliary transistor, while the impedance of the portion of the divider included between the base and emitter of this transistor is small with respect to its base input resistance. If this latter condition is not fulfilled, it is evident from the equivalent circuit diagram that the result will be as a first resistor connected in parallel with and a second resistor connected in series with the series-combination of diodes, an undesirable effect in many cases.

The invention will now be described more fully with reference to the embodiment shown in the figure. The embodiment is a modification of the circuit arrangement shown in FIG. 1 of the aforesaid U.S. application, but the principle of the invention can be applied to each of the circuit arrangements described in that application. The figure shows two junction transistors $T_1$ and $T_2$, the collector of the transistor $T_1$ being connected to the base of the transistor $T_2$ while a phase-shifting feedback coupling including a capacitor C is provided between the emitters of the transistors $T_1$ and $T_2$. Instead of the series-combination of several diodes polarized in the forward direction, an auxiliary transistor $T_{10}$ is provided in the collector circuit of transistor $T_1$, the forward direction of the current through this auxiliary transistor being equal to the current through transistor $T_1$. The base of the auxiliary transistor $T_{10}$ is connected to a tap of a voltage divider potentiometer included between the emitter and the collector of the transistor $T_{10}$. The potentiometer is a preferred form consists of two capacitors $C_{11}$ and $C_{12}$, while a source 13 supplies the base bias current of the auxiliary transistor $T_{10}$. If the capacitor $C_{12}$ is $n$-1 times greater than the capacitor $C_{11}$, the combination $T_{10}$–$C_{11}$–$C_{12}$ behaves like the series-combination of $n$ semiconductor diodes.

The capacitors $C_{11}$ and $C_{12}$ may also replace the capacitor $C_5$ illustrated in the aforesaid U.S. patent application and, together with the emitter-collector differential resistance which the transistor $T_{10}$ seems to exhibit constitute an impedance arrangement in the collector circuit of the transistor $T_1$ in combination with the phase-shifting feedback coupling of capacitor C, a resonant circuit arrangement of high selectivity is realized. If the capacitors $C_{11}$, $C_{12}$ and C are of substantially the same value, the resulting arrangement operates in substantially the same manner as the circuit arrangement shown in FIG. 1 of the aforesaid U.S. patent application. However, the capacitor $C_{11}$ is preferably chosen to be substantially smaller so that the combination $T_{10}$–$C_{11}$–$C_{12}$ behaves like a series-combination of more than two diodes, in which case the value of the phase-shifting feedback coupling achieved by means of the capacitor C must also be adapted thereto.

In the present invention, the base of the transistor $T_1$ is not connected to a point of constant potential as shown in the aforesaid U.S. application, but to a tap 14 on the emitter resistor $R_2$ of the transistor $T_2$. The position of the tap 14 is chosen so that at resonance the circuit arrangement will insure that the product of the amplification and feedback remains substantially equal to unity. If the capacitor $C_{12}$ is $n$-$1$ times greater than the capacitor $C_{11}$, the portion of the resistance $R_2$, measured between the emitter of the transistor $T_2$ and the tap 14, should amount to $2R_2/n$. This value must remain low with respect to the base input resistance of the transistor $T_1$.

What is claimed is:

1. A tuned circuit arrangement comprising first and second transistors each having emitter, base and collector electrodes, means connecting the collector electrode of the first transistor to the base electrode of the second transistor, phase shift feedback coupling means connected between an input electrode of said first transistor and an output electrode of said second transistor, an auxiliary transistor having emitter, base and collector electrodes, and having its emitter collector path connected in a direction supplying current through the collector electrode of said first transistor, a tapped voltage divider connected across the emitter and collector electrodes of said auxiliary transistor, and means connecting the base electrode of said auxiliary transistor to the tap on said divider.

2. The combination of claim 1 further including means applying a bias voltage of the collector electrode of said second transistor and the collector electrode of said auxiliary transistor, and means connecting the emitter electrode of said auxiliary transistor to the collector electrode of said first transistor.

3. The combination of claim 1 wherein said voltage divider comprises first and second arms defined by first and second ends thereof and said tap, each of said arms comprising a capacitor.

4. The combination of claim 3 wherein said voltage divider arms are provided with sufficient impedance relative to said auxiliary transistor such that current flow through said divider is negligible with respect to said auxiliary transistor and the impedance of that arm between the base and emitter electrodes of said auxiliary transistor is small with respect to the base electrode input resistance of said auxiliary transistor.

5. The combination of claim 3 wherein that capacitor of said divider positioned between the base and collector electrodes of said auxiliary transistor is substantially smaller than the other capacitor of said divider.

6. A tuned circuit arrangement comprising first and second transistors each having emitter, base and collector electrodes, means connecting the collector electrode of first transistor to the base electrode of the second transistor, phase shift feedback coupling means connected between the emitter electrode of said first transistor and the emitter electrode of said second transistor, an auxiliary transistor having emitter, base and collector electrodes, means applying a bias voltage to the collector electrode of said second transistor and the collector electrode of said auxiliary transistor, means connecting the emitter electrode of said auxiliary transistor to the collector electrode of said first transistor, a tapped voltage divider connected across the emitter and collector electrodes of said auxiliary transistor, and means connecting the base electrode of said auxiliary transistor to the tap on said divider, said voltage divider comprising first and second arms defined by first and second ends thereof an said tap, each of said arms comprising a capacitor.

References Cited

UNITED STATES PATENTS 3,125,693 3/1964 De Clue ---------- 330—18 X

NATHAN KAUFMAN, Primary Examiner

U.S. Cl. X.R.

330—16, 21